(12) United States Patent
Wong et al.

(10) Patent No.: US 12,411,112 B2
(45) Date of Patent: Sep. 9, 2025

(54) TRANSDUCER, DEVICE AND METHOD FOR MONITORING INTEGRITY OF AN ADHESIVE BOND

(71) Applicant: AGENCY FOR SCIENCE, TECHNOLOGY AND RESEARCH, Singapore (SG)

(72) Inventors: Zheng Zheng Wong, Singapore (SG); Kui Yao, Singapore (SG); Shuting Chen, Singapore (SG); Lei Zhang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 666 days.

(21) Appl. No.: 17/286,318

(22) PCT Filed: Oct. 25, 2019

(86) PCT No.: PCT/SG2019/050526
§ 371 (c)(1),
(2) Date: Apr. 16, 2021

(87) PCT Pub. No.: WO2020/086003
PCT Pub. Date: Apr. 30, 2020

(65) Prior Publication Data
US 2021/0341427 A1    Nov. 4, 2021

(30) Foreign Application Priority Data
Oct. 26, 2018  (SG) .......................... 10201809486R

(51) Int. Cl.
*G01N 29/11* (2006.01)
*G01N 29/04* (2006.01)
*G01N 29/24* (2006.01)

(52) U.S. Cl.
CPC .......... *G01N 29/11* (2013.01); *G01N 29/043* (2013.01); *G01N 29/2418* (2013.01);
(Continued)

(58) Field of Classification Search
CPC ................................. G01N 29/04–14
See application file for complete search history.

(56) References Cited

U.S. PATENT DOCUMENTS

| | | | | |
|---|---|---|---|---|
| 4,350,916 A | * | 9/1982 | August | H03H 3/08 348/198 |
| 4,734,228 A | * | 3/1988 | Micheron | H10N 30/098 29/25.35 |

(Continued)

FOREIGN PATENT DOCUMENTS

WO    WO-2019071849 A1 *  4/2019  ........... B06B 1/0603

OTHER PUBLICATIONS

Araldite 2015 Datasheet (Year: 2015).*
(Continued)

*Primary Examiner* — Judy Nguyen
*Assistant Examiner* — James Split
(74) *Attorney, Agent, or Firm* — Harness, Dickey & Pierce, P.L.C.

(57) ABSTRACT

A transducer for monitoring integrity of an adhesive bond between a first element and a second element, the transducer comprising: a transducing adhesive, the transducing adhesive provided to act as at least one of: an actuator to convert an electrical signal to an acoustic signal and a sensor to convert an acoustic signal to an electrical signal; and an electrode provided on the transducing adhesive, the electrode provided to perform at least one of: providing an electrical signal to the transducing adhesive and receiving an electrical signal from the transducing adhesive; wherein, in use, the transducer is provided at least partially in the
(Continued)

adhesive bond between the first element and the second element, and the acoustic signal is passed through the adhesive bond.

21 Claims, 10 Drawing Sheets

(52) U.S. Cl.
CPC ............... *G01N 2291/0235* (2013.01); *G01N 2291/0237* (2013.01); *G01N 2291/267* (2013.01)

(56) References Cited

U.S. PATENT DOCUMENTS

| | | | | |
|---|---|---|---|---|
| 4,944,185 | A * | 7/1990 | Clark, Jr. | G01N 29/2475 324/214 |
| 6,051,327 | A * | 4/2000 | Serafin | B32B 15/08 428/458 |
| 6,127,822 | A * | 10/2000 | Sasahara | G01N 27/82 324/240 |
| 6,260,415 | B1 * | 7/2001 | Goebel | G01N 29/2475 73/801 |
| 6,810,750 | B1 * | 11/2004 | Kiefer | G01L 1/165 73/788 |
| 7,411,338 | B1 * | 8/2008 | Sanderson | G01P 15/0885 310/339 |
| 7,589,457 | B2 * | 9/2009 | Lee | G01N 29/045 310/338 |
| 8,677,380 | B2 * | 3/2014 | Akutsu | G11B 7/22 720/648 |
| 11,231,397 | B2 * | 1/2022 | Safai | G01N 29/2462 |
| 2007/0214623 | A1 | 9/2007 | Lee et al. | |
| 2014/0327433 | A1 | 11/2014 | Anway et al. | |
| 2016/0133826 | A1 | 5/2016 | Yao et al. | |
| 2018/0364199 | A1 * | 12/2018 | Pahlavan | G01N 29/265 |
| 2019/0302064 | A1 * | 10/2019 | Cai | G01N 29/46 |

OTHER PUBLICATIONS

Araldite 2021 Datasheet (Year: 2007).*
Araldite 2021 Safety Data Sheet (Year: 2011).*
R.S.C. Monkhouse, P.D. Wilcox, P. Cawley, Flexible interdigital PVDF transducers for the generation of Lamb waves in structures, Ultrasonics, vol. 35, No. 7, 1997, pp. 489-498 (Year: 1997).*
International Search Report and Written Opinion of the International Searching Authority, issued in PCT/SG2019/050526, mailed Jan. 15, 2020; ISA/SG.
Gregory L. Anderson et al., Monitoring Adhesive Joints Using Piezoelectric Polymer Film. Journal of Intelligent Material Systems and Structures, Jul. 1, 1993, vol. 4, No. 3, pp. 425-428.
H. Y. Hwang et al., Diagnosis criterion for damage monitoring of adhesive joints by a piezoelectric method. Journal of Adhesion Science and Technology, Apr. 2, 2012, vol. 19, No. 12, pp. 1053-1080.

* cited by examiner

TRANSDUCER, DEVICE AND METHOD FOR MONITORING INTEGRITY OF AN ADHESIVE BOND

CROSS-REFERENCE TO RELATED APPLICATIONS

This application is a 35 U.S.C. 371 U.S. National Phase of International Application No. PCT/SG2019/050526, filed Oct. 25, 2019, which claims priority to Singaporean patent application Ser. No. 10/201,809486R, filed Oct. 26, 2018. The entire disclosures of the above applications are incorporated herein by reference.

FIELD OF THE INVENTION

This invention relates to a transducer, a device and a method for monitoring integrity of an adhesive bond between a first element and a second element.

BACKGROUND OF THE INVENTION

Compared to mechanical fasteners, usage of structural adhesives to bond parts in newly manufactured structures or to repair damaged structures with repair patches offer advantages in lighter weight, better fatigue performance due to absence of fastener holes, shorter manufacturing cycle time and economical bonded structural repair after non-catastrophic damage. Manufacturers in the automotive, aerospace, marine, wind energy and construction industries have increasingly embraced structural adhesives in their products. It is estimated conservatively that the structural adhesives market was worth USD 4.5 billion in 2016 and projected to be worth USO 6-7 billion by 2020 The importance of structural adhesives in the aerospace industry has been growing significantly and will continue to do so in future. There will be increasingly more opportunities for use of adhesives in primary and secondary composite aerostructures. However, integrity of the adhesive bond in a newly manufactured structure or between the damaged structure and the repair patch needs to be monitored in order to monitor the health of the structure and to ensure that the repaired structure continues to meet safety regulations during use. Current structural health monitoring (SHM) systems typically involve a sensor network comprising a large number of discrete sensors, such as strain gauges and optical fibre sensors placed on the area being monitored. However, in many applications, such monitoring can only be performed when the repaired structure is not in use as it may not be possible or feasible to apply the gauges and sensors on the structure during use, for example in the case of a repaired fuselage, so that repair failure during use may go undetected and pose a safety hazard. Furthermore, application of gauges and sensors is labour and time intensive, as well as dependent on human operator skill.

SUMMARY OF INVENTION

Disclosed in this application is a transducer, a device comprising the transducer and a method for structural health monitoring (SHM) that monitors the integrity of an adhesively bonded structure by utilizing the electromechanical property of the adhesive itself as a transduction mechanism for generating and/or detecting an acoustic signal as a structural health indicator. Actuators for generating the acoustic signal and/or sensors for detecting the acoustic signal are designed and produced from the adhesive. The acoustic signal can be compared with a predetermined "signature" signal of the intact structure, where a deviation from the signature signal can indicate the presence of a defect.

Structural health monitoring (SHM) in which the integrity of the structures including joints and bonds of interest is autonomously monitored (possibly on a continuous basis) presents a paradigm-shifting approach that can improve standard industry practice. In an adhesive bonded structure, utilizing the adhesive itself as the actuator/sensor for monitoring the joint integrity (i.e. the adhesive performs dual roles of structural bonding and actuating/sensing) can help achieve the following benefits:

Reduce labour, time and human-factor errors required for non-destructive testing of bonded structures with adhesive Avoid the potential problems of degraded bond performance and additional weight due to introduction of a "foreign" actuator and/or sensor component to monitor integrity of the adhesive bond According to a first exemplary aspect, there is provided a transducer for monitoring integrity of an adhesive bond between a first element and a second element, the transducer comprising: a transducing adhesive, the transducing adhesive provided to act as at least one of: an actuator to convert an electrical signal to an acoustic signal and a sensor to convert an acoustic signal to an electrical signal; and an electrode provided on the transducing adhesive, the electrode provided to perform at least one of: providing an electrical signal to the transducing adhesive and receiving an electrical signal from the transducing adhesive; wherein, in use, the transducer is provided at least partially in the adhesive bond between the first element and the second element, and the acoustic signal is passed through the adhesive bond.

The transducing adhesive may comprise an epoxy adhesive having a piezoelectric effect.

The transducing adhesive may comprise bisphenol/diamine-based epoxy.

The transducing adhesive may comprise a methylmethacrylate-based adhesive.

The transducing adhesive may comprise a mixture of an epoxy adhesive and lead-free piezoelectric ceramic particles.

The lead-free piezoelectric ceramic may comprise $(K_{0.44}Na_{0.52}Li_{0.04})(Nb_{0.84}Ta_{0.10}Sb_{0.06})O_3$., and volume of the lead-free piezoelectric ceramic particles in the transducing adhesive may range from 15% to 25%.

The transducing adhesive may have been exposed to at least one of a direct current electric field or a corona discharge.

The acoustic signal may be a guided ultrasonic wave signal.

The acoustic signal may be an ultrasonic Lamb wave signal.

The electrode may have a comb-like pattern comprising fingers, and wherein periodicity of the fingers corresponds to a wavelength of the acoustic signal.

According to a second exemplary aspect, there is provided a device for monitoring integrity of an adhesive bond between a first element and a second element, the device comprising: a first transducer comprising the transducer of the first exemplary aspect provided at least partially in the adhesive bond between the first element and the second element; wherein the adhesive bond comprises a bonding adhesive provided between the first element and the second element, the bonding adhesive comprising a same material as the transducing adhesive, and wherein determination of integrity of the adhesive bond is achieved by analysing the acoustic signal that has passed through the adhesive bond.

The transducing adhesive and at least part of the electrode are provided between the bonding adhesive and the first element.

When the first transducer is provided to act as an actuator to generate an acoustic signal, the device further may comprise an acoustic signal receiver provided to receive an acoustic signal that may be passed through the bonding adhesive from the first transducer.

The acoustic signal receiver may comprise one of: a laser scanning vibrometer, a discrete piezoelectric sensor and a second transducer comprising the transducer of the first aspect, the second transducer provided to act as a sensor to detect an acoustic signal.

When the first transducer is provided to act as a sensor to detect an acoustic signal, the device further may comprise an acoustic signal generator provided to generate an acoustic signal that may be passed through the bonding adhesive to the first transducer. The acoustic signal generator may comprise one of: a pulsed laser, a discrete piezoelectric actuator and a second transducer comprising the transducer of the first aspect, the second transducer provided to act as an actuator.

Analysing the acoustic signal may include comparing the acoustic signal that has passed through the adhesive bond with a predetermined reference signal, and deviation of the acoustic signal that has passed through the adhesive bond from the reference signal may be indicative of presence of a defect in the adhesive bond The transducing adhesive may be integral with the bonding adhesive, wherein the first transducer may be provided to act as an actuator to generate an acoustic signal that may be passed through the bonding adhesive, wherein the first transducer may be further provided to act as a sensor to detect an echo of the acoustic signal that has passed through the bonding adhesive for determining thickness of the bonding adhesive, and wherein thickness of the bonding adhesive may be correlatable with presence of a defect in the adhesive bond.

According to a third exemplary aspect, there is provided a method of monitoring integrity of an adhesive bond between a first element and a second element, the method comprising the steps of:
(a) generating an acoustic signal;
(b) passing the acoustic signal through the adhesive bond;
(c) receiving the acoustic signal that has passed through the adhesive bond; and
(d) comparing the acoustic signal that has passed through the adhesive bond with a predetermined reference signal;
wherein at least one of step (a) and step (c) is performed by a transducing adhesive provided to act as at least one of: an actuator to generate the acoustic signal and a sensor to receive the acoustic signal.

The transducing adhesive may be comprised in a transducer of the first exemplary aspect.

Deviation of the acoustic signal that has passed through the adhesive bond from the reference signal may be indicative of presence of a defect in the adhesive bond.

Both step (a) and step (c) may be performed by a transducer of the first exemplary aspect.

The method may further comprise the steps of:
(e) determining thickness of the bonding adhesive and
(f) correlating thickness of the bonding adhesive with presence of a defect in the adhesive bond.

BRIEF DESCRIPTION OF FIGURES

In order that the invention may be fully understood and readily put into practical effect there shall now be described by way of non-limitative example only exemplary embodiments of the present invention, the description being with reference to the accompanying illustrative drawings.

DETAILED DESCRIPTION

Figure 1:
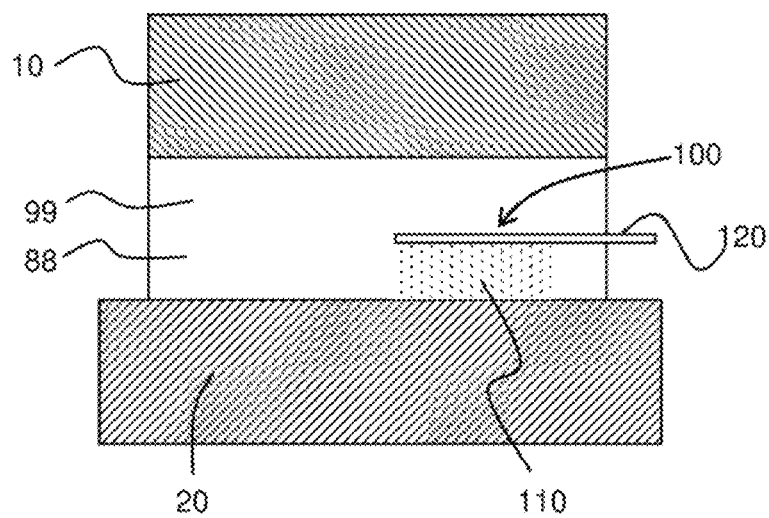
FIG. 1 is a cross-sectional side view of an exemplary transducer provided in an adhesive bond between a first element and a second element.

Exemplary embodiments of the transducer 100, the device 200 comprising the transducer 100 and the method 300 for monitoring integrity of the adhesive bond 99 will be described with reference to FIGS. 1 to 20 in which the same reference numerals are used across the figures to refer to the same or similar parts. FIGS. 3, 8, 11, 14, 15 and 19 are for illustration only and not drawn to scale.

As shown in FIG. 1, in general, the transducer 100 for monitoring integrity of an adhesive bond 99 between a first element 10 (such as a newly manufactured top part or repair patch) and a second element 20 (such as a newly manufactured bottom part or parent structure requiring repair) comprises a transducing adhesive 110 and an electrode 120 provided on the transducing adhesive 110. The adhesive bond 99 comprises a bonding adhesive 88 provided between the first element 10 and the second element 20. The transducing adhesive 110 may convert an electrical signal to an acoustic signal (as shown in FIGS. 3, 8, 15 and 19) so that the transducer 100 acts as an actuator 101 to generate an acoustic signal, or may convert an acoustic signal to an electrical signal (as shown in FIGS. 11, 14, 15 and 19) so that the transducer 100 acts as a sensor 102 to detect an acoustic signal. The electrode 120 may provide an electrical signal to the transducing adhesive 110 or may receive an electrical signal from the transducing adhesive 110. In use, the transducer 100 is provided in the adhesive bond 99 between the first element 10 and the second element 20, and the acoustic signal is passed through the adhesive bond 99 as indicated by the arrows in FIGS. 3(a), 8(a), 11(a), 14(a), 15(a) and 19(b). In exemplary embodiments, the parent structure 20 requiring repair may comprise vehicular parts such as aircraft fuselage or machine components and the repair patch 10 may be of any appropriate known material, such as a metal or a composite material. In an exemplary embodiment, the bonding adhesive 88 may comprise a same material as the transducing adhesive 110.

Figure 2:
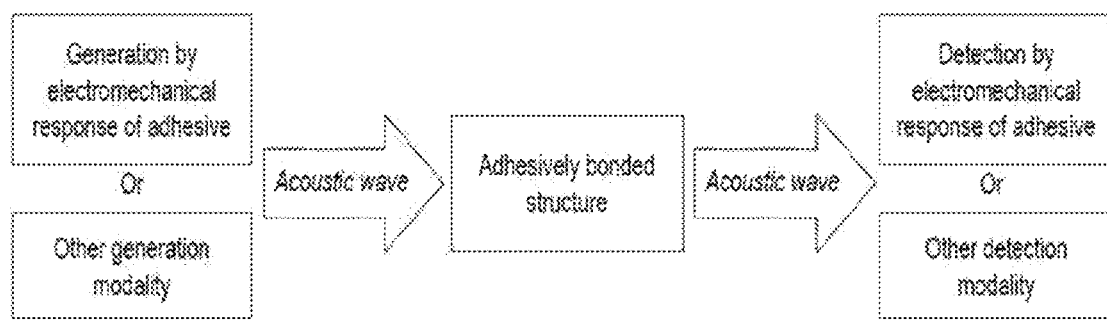
FIG. 2 is a schematic illustration of an adhesive-based SHM method where an acoustic wave generated by an adhesive or other actuating modality is transmitted and then detected by adhesive or other sensing modality, with the adhesively bonded structure along the transmission path being monitored.

As an acoustic signal can also be generated and detected by other modalities, such as via laser or discrete piezoelectric transducers (as will be described in greater detail below), the transducer 100 acting as an adhesive actuator 101 or adhesive sensor 102 can be implemented in combination with other ways of acoustic signal detection or generation, as schematically illustrated in FIG. 2, in order to form the device 200 for monitoring integrity of the adhesive bond 99 between the first element 10 and the second element 20. For an adhesive to be able to generate and detect acoustic wave, it is preferred for the transducing adhesive 110 to possess the ability to convert electrical energy to mechanical energy and vice versa, which is called electromechanical property or response in this disclosure. Such an electromechanical property can be inverse and direct piezoelectric effect of a piezoelectric material with non-symmetrical structure, or effective inverse and direct piezoelectric effect from an electret. An electret is defined as any material that retains its electric polarization and exhibits effective piezoelectric behaviour after subjected to an electric field.

In devising the transducer 100, it was found that some existing aerospace-certified adhesives, such as epoxy-based commercial products, Araldite 2011, Araldite 2015, methacrylate-based Araldite 2021 from Huntsman, and epoxy-based FM73M from Cytec, possess certain piezoelectric response. The inherent piezoelectric property of these adhesives was explored for utilization in the transducer 100 as the transducing adhesive 110 to generate and detect acoustic waves, with dedicated acoustic actuator and sensor design for monitoring bond integrity in adhesively bonded structures.

In general, a device 200 to monitor integrity of the adhesive bond 99 between the first element 10 and the second element 20 may thus comprise the transducer 100 as described above provided in the adhesive bond 99 between the first element 10 and the second element 20. The bonding adhesive 88 of the adhesive bond 99 may comprise a same material as the transducing adhesive 110, and determination of integrity of the adhesive bond 99 is achieved by analysing the acoustic signal that has passed through the adhesive bond. Analysing the acoustic signal may include comparing the acoustic signal that has passed through the adhesive bond 99 with a predetermined reference signal.

Transducer Acting as Actuator

Figure 3:
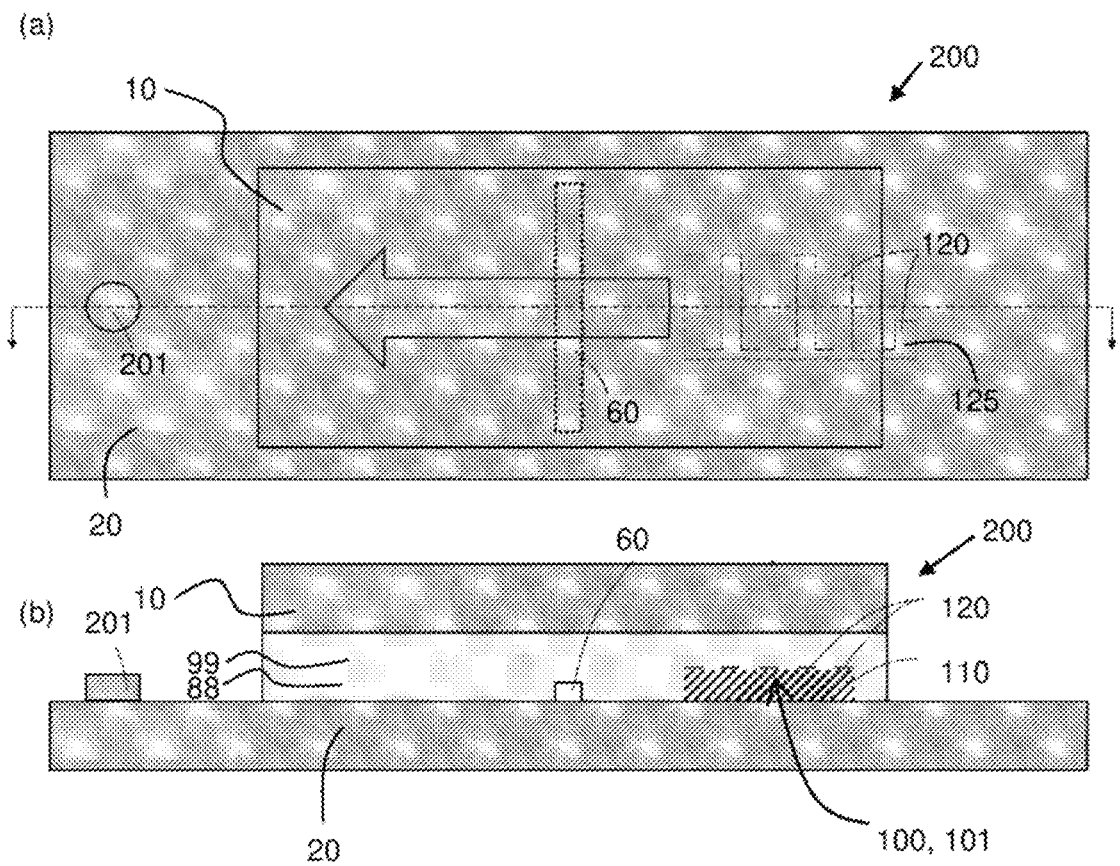
FIG. 3(a) is a top view of a device comprising the transducer of FIG. 1 acting as an actuator and having an acoustic signal receiver comprising a discrete sensor.
FIG. 3(b) is a cross-sectional side view of the device of FIG. 3(a).
Figure 4:
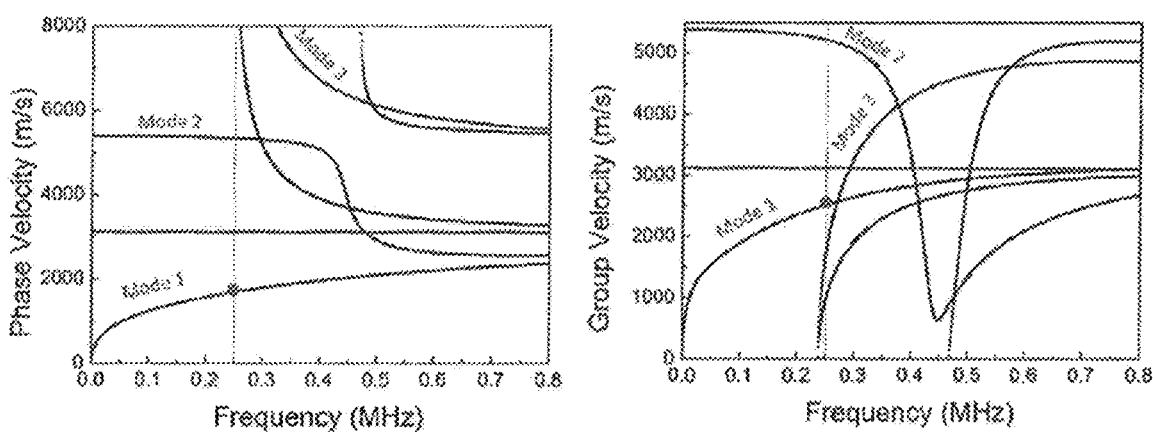
FIG. 4 is dispersion curves for selection of design frequency as indicated by the black dots.
Figure 20:
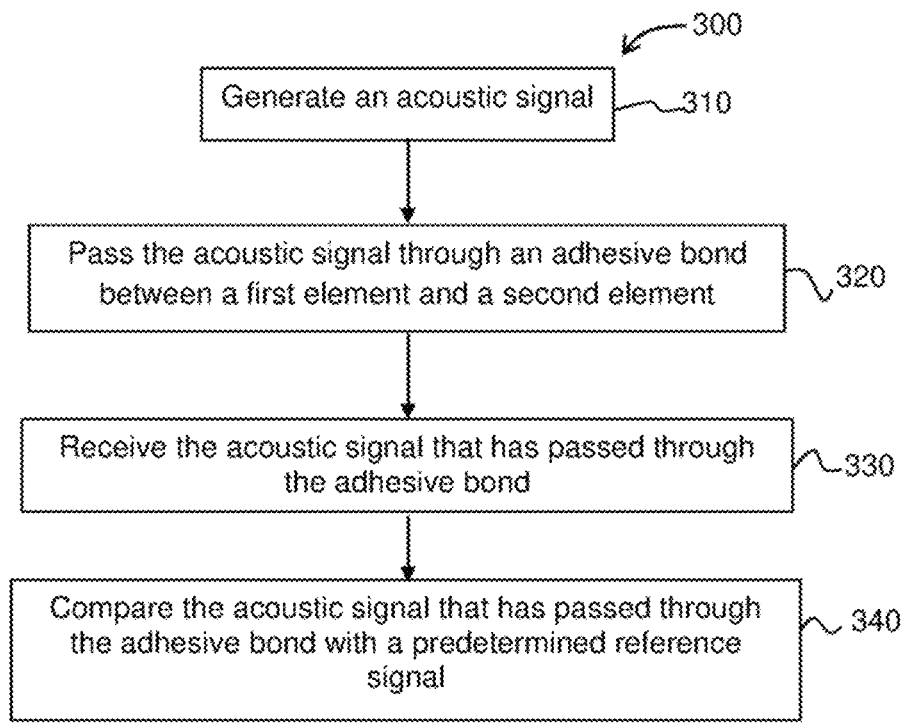
FIG. 20 is a flowchart of an exemplary embodiment of a method of monitoring integrity of an adhesive bond.

Using a first exemplary embodiment of the device 200 as shown in FIG. 3 where the transducer 100 acts as an actuator 101, integrity of an adhesively bonded structure may be monitored. The adhesively bonded structure consists of a first element 10 (e.g. a repair patch) attached via an adhesive 88 with electromechanical property to a second element 20 (e.g. a parent structure) to form an adhesive bond 99. An exemplary method 300 of the monitoring comprises analysing acoustic wave signals generated by the transducer 100 in the adhesive bond 99 and detected by an acoustic signal receiver 201 of the device 200. The method 300 (as shown in FIG. 20) of monitoring the adhesive bond 99 using embodiments of the device 200 where the transducer 100 acts as an actuator thus comprises the steps of generating an acoustic signal 310 (in such embodiments using the transducer 100 acting as an actuator), passing the acoustic signal through the adhesive bond 99, 320, receiving the acoustic signal that has passed through the adhesive bond 99, 330 (in such embodiments using the acoustic signal receiver 201), and comparing the acoustic signal that has passed through the adhesive bond 99 with a predetermined reference signal 340. In an exemplary embodiment, the acoustic signal may be a guided ultrasonic wave signal. The acoustic signal receiver 201 may comprise a discrete sensor attached onto the structure as shown in FIG. 3, for example, on the parent structure 20. The discrete sensor 201 may be a piezoelectronic ultrasonic sensor, for example, a piezoelectric ceramic sensor made of lead zirconate titanate (PZT). It should be noted that for all embodiments of the device 200, the electrode 120 may be positioned on the transducing adhesive 110 of the transducer 100 under the repair patch 10, as shown in FIG. 2(*b*), or positioned outside the footprint of the repair patch 10.

The transducing adhesive 110 requires poling by a DC electric field or corona discharge to induce its electromechanical property. To generate acoustic waves, a dedicatedly designed electrode 120 is formed or otherwise provided on the transducing adhesive 110 which, as an actuator 101, converts electrical signals from the electrode 120 into an acoustic signal or wave. The acoustic wave, which can be a bulk wave such as a Lamb wave, a surface wave such as a Rayleigh wave, a mode-converted Rayleigh-Lamb wave or a transverse (shear) wave, is transmitted to another part of the adhesively bonded structure, where it is detected by the discrete ultrasonic sensor 201. The electrode 120 can be a patterned (e.g. comb) or non-patterned conductive layer deposited on top of the transducing adhesive 110. The deposited conductive layer, whether serving as a top or bottom electrode 120, may be metallic (e.g. aluminium, gold, silver) or a conductive inorganic material (e.g. carbon nanotubes) or a conductive organic material (e.g. poly(3,4-ethylenedioxythiophene) polystyrene sulfonate). The electrode 120 may be deposited by aerosol spraying, screen-printing, inkjet printing, or physical vapour deposition such as sputtering or evaporative deposition.

In a preferred embodiment, the adhesive used for both the bonding adhesive 88 and the transducing adhesive 110 was a bisphenol/diamine-based epoxy, such as Araldite 2015, and the material of the repair patch 10 and parent structure 20 was 2024 aluminium alloy. To form the device 100, a first layer of adhesive was applied with a film applicator through a mask template to the parent structure, with a film thickness of about 50 μm to 70 μm. The aluminium electrode 120 layer was deposited via a shadow mask to form a comb pattern by using evaporative deposition, with a thickness of about 200 nm. To induce piezoelectric property and thereby form the transducing adhesive 110, the first adhesive layer was poled by a DC electric field or corona discharge.

As a top electrode 120, the comb-patterned electrode 120 has a periodicity identical to that of the wavelength of a selected wave mode (i.e. the gaps between the central lines of two adjacent electrode comb fingers correspond to the wavelength of the acoustic wave to be generated). For example, to produce a Lamb wave of Mode 1 with central frequency of 250 kHz and phase velocity of 1684 m/s (as shown in the phase velocity plot of FIG. 4), the comb electrode periodicity corresponding to a wavelength of 6.74 mm was required. The aluminium parent structure 20 was used or served as a bottom electrode. When the second element 20 or parent structure is not conductive, another conductive layer is to be deposited as the bottom electrode (not shown).

Figure 5A:
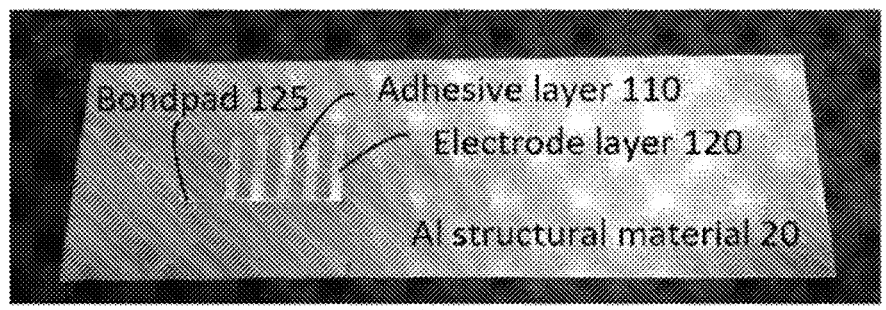
FIG. 5(a) is a photograph of an electrode comb on a first adhesive layer on a structural material before installation of a repair patch.
Figure 5B:
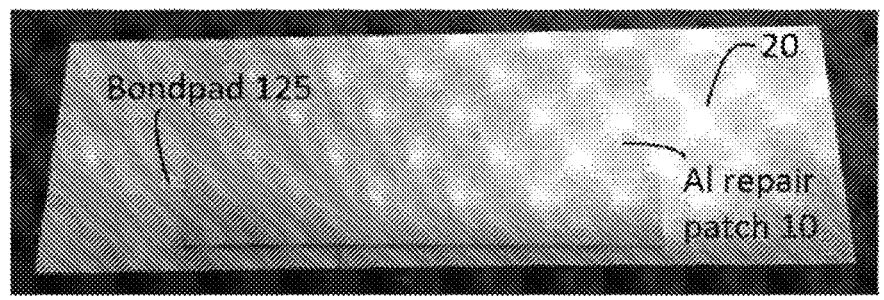
FIG. 5(b) is a photograph of a bonded structure with actuator after installation of the repair patch

To install the repair patch 10, a second layer of adhesive was applied via the film applicator and mask template to produce a final total adhesive 88 thickness of 100 μm to 150 μm, after which the repair patch 10 was positioned on top of the wet, uncured adhesive 88. Light pressure was first applied manually on the repair patch 10, followed by applying a moderate pressure load during the curing of the adhesive 88. When the curing of the adhesive 88 was completed, the adhesive actuator 101 was in-situ integrated with the bonded structure in the adhesive bond 99 between the repair patch 10 and the parent structure 20. FIG. 5 shows photographs of a sample parent structure 20 before installation of the repair patch 10 and after installation of the repair patch 10. To simulate the presence of a disbond (defect), a void region 60 in the adhesive layer was created by positioning a PTFE rectangular strip of 30 mm to 40 mm in width and 0.03 mm in height on the second layer of wet, uncured adhesive 88 before installing the repair patch 10 and extracting this PTFE strip after the adhesive 88 had cured fully.

For acoustic testing, a function generator was used to produce a N-cycled burst of sine wave or Hanning-windowed tone burst with cycle number N (e.g. N=3, 3.5, 5 or 5.5 typically), at the selected frequency of 250 kHz. A power amplifier was used to amplify signal, for example, generating a peak-to-peak voltage of 80 to 200 V typically to drive the adhesive actuator 101. After passing through the transmission path, the acoustic wave signal was detected by the discrete sensor 201 and collected by an oscilloscope. The received signal was processed by various signal processing methods and analysed to obtain the structural health information of the adhesive bond 99.

For an intact structure, the received acoustic wave signal constituted a reference or baseline signal. Subsequently, monitoring of the bonded structure was conducted by comparing received signals with the said reference signal. The reference signal could be considered as a "signature" signal associated uniquely with the particular structure and a deviation from the signature could indicate defect presence in the structure.

Figure 6:
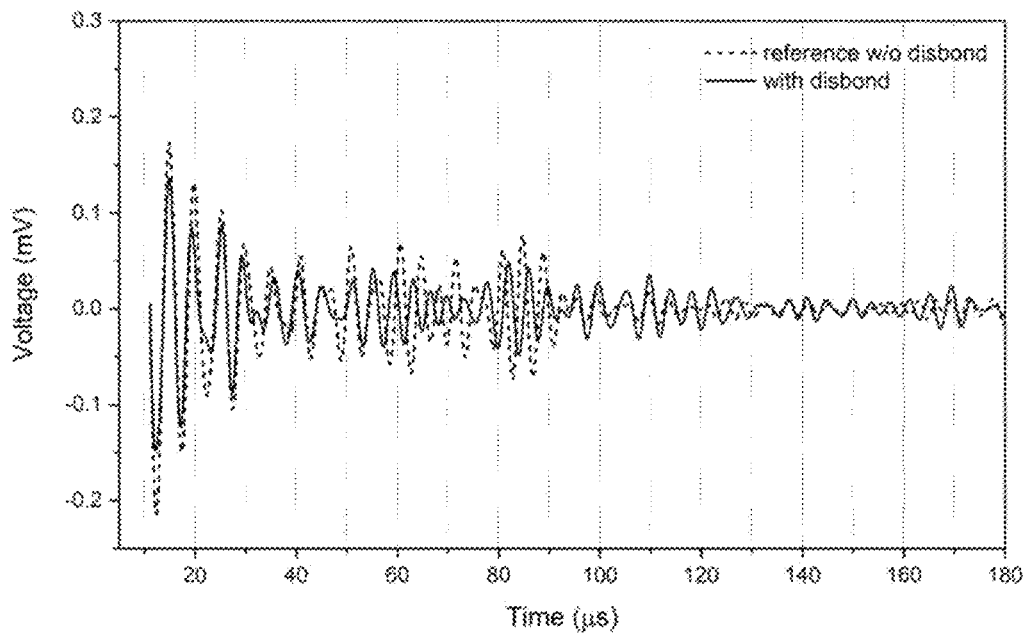
FIG. 6 is a graph comparing a reference signal with a "defect" signal in a time domain, using the device of FIG. 3.

The received acoustic wave signal in the time domain was band-filtered suitably by considering the actuation frequency and the band-filtered signal was compared with the signature signal in the time domain. A deviation from the signature (e.g. change in overall waveform or amplitude, change in waveform or amplitude or the time of arrival of a particular wave packet etc.) could indicate the presence of defect in the adhesive bond 99. FIG. 6 presents an example of comparison of signature signal with the "defect" signal in the time domain.

Figure 7:
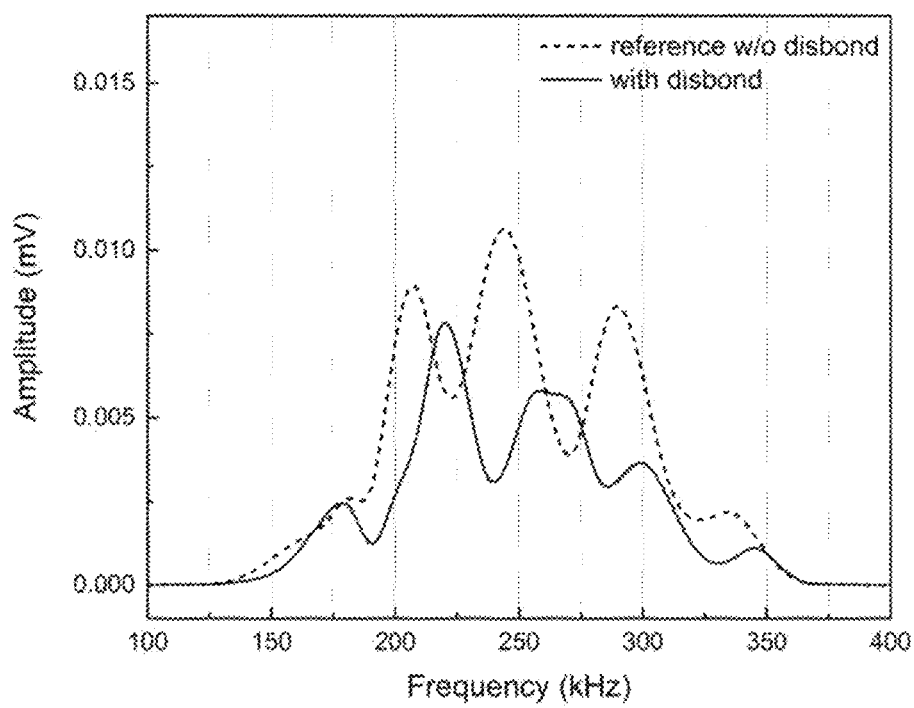
FIG. 7 is a graph comparing a reference FFT spectrum and a "defect" FFT spectrum obtained using the device of FIG. 3.

The frequency characteristics of the acoustic wave signal were extracted via Fast Fourier Transform (FFT) to yield a FFT spectrum. By comparing with the FFT spectrum of the original state as the reference, a change in the FFT spectrum (e.g. change in peak amplitudes, shift in peak frequencies, etc.) could indicate the presence of defect. FIG. 7 presents an example of comparison between reference FFT spectrum and the "defect" FFT spectrum, using adhesive actuator and discrete piezoelectric sensor.

Figure 8:
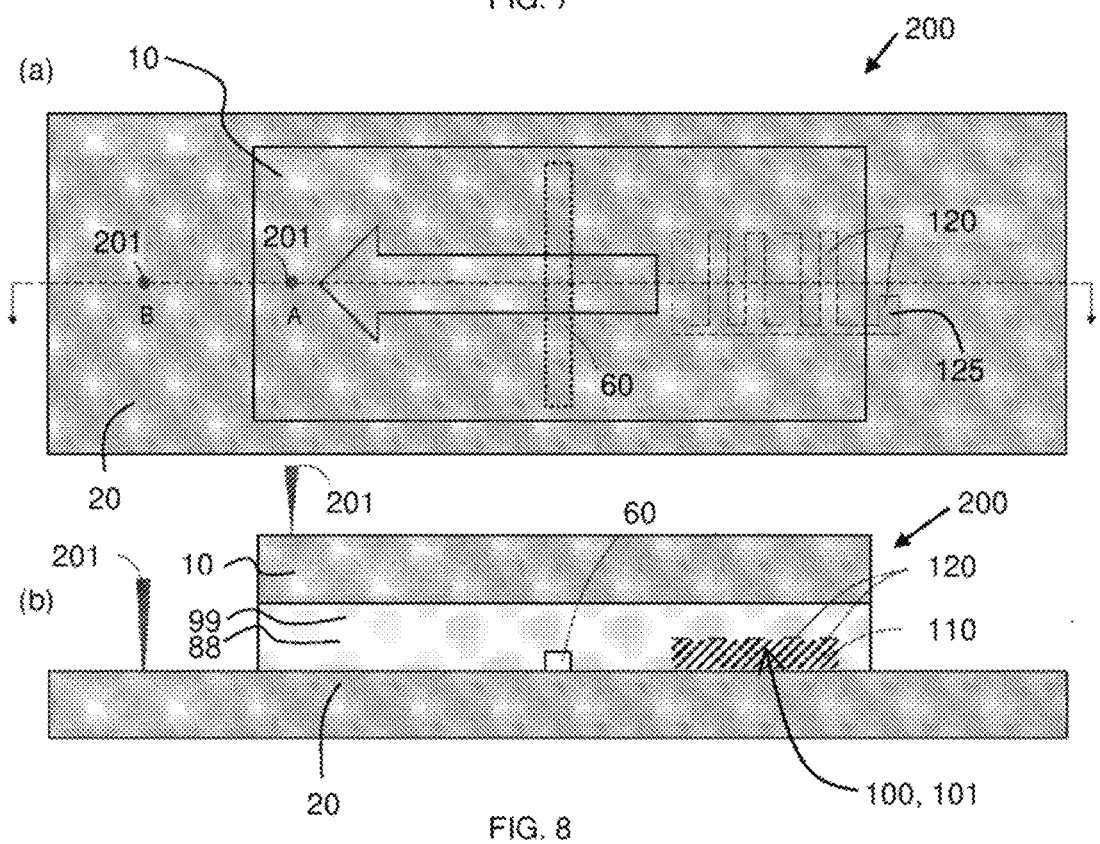
FIG. 8(a) is a top view of a device comprising the transducer of FIG. 1 acting as an actuator and having an acoustic signal receiver comprising at least one laser scanning vibrometer.
FIG. 8(b) is a cross-sectional side view of the device of FIG. 8(a).
Figure 9:
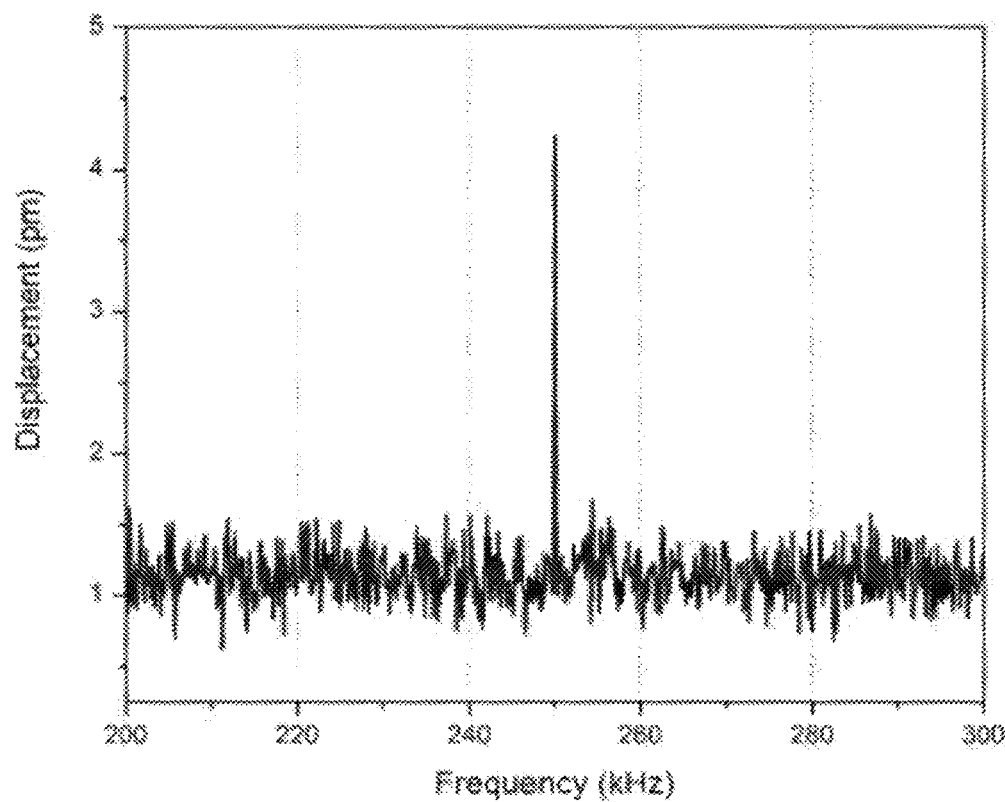
FIG. 9 is a graph showing FFT vibration peak of an acoustic wave signal generated by the transducer in the device of FIG. 8 and detected by a laser scanning vibrometer on a repair patch.
Figure 10:
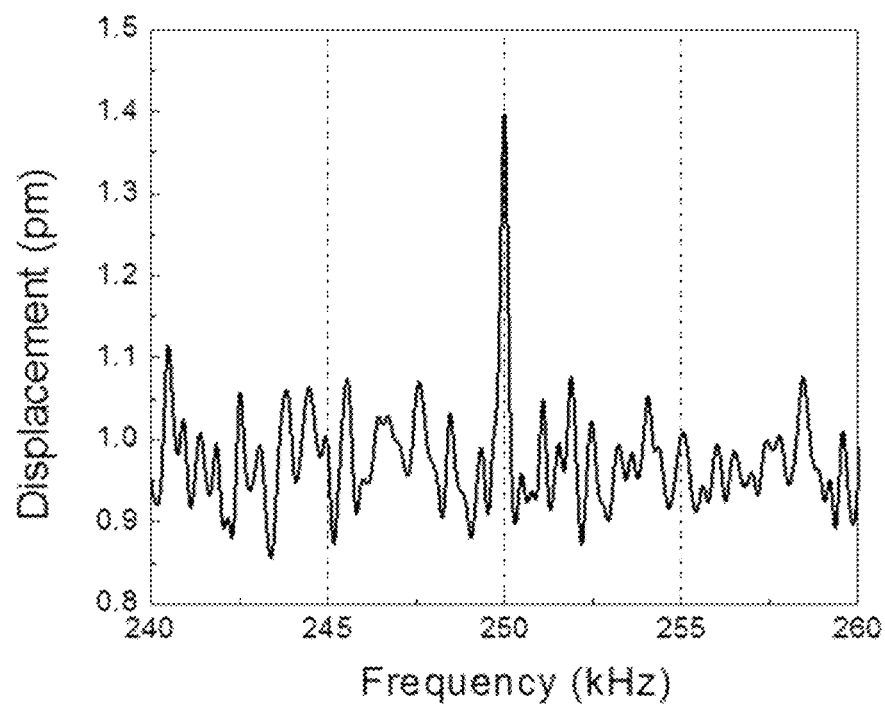
FIG. 10 is a graph showing FFT vibration peak of an acoustic wave signal generated by the transducer in the device of FIG. 8 and detected by a laser scanning vibrometer on a parent structure.

In an alternative exemplary embodiment of the device 200, instead of the acoustic signal receiver 201 comprising a discrete piezoelectric sensor as shown in FIG. 3, the acoustic signal receiver 201 may instead comprise at least one laser scanning vibrometer (LSV) as shown in FIG. 8. Acoustic waves generated by the transducer 100 acting as an adhesive actuator 101 were detected by LSV on the repair patch 10 as well as on the parent structure 20. If a disbond is formed in the adhesive bond 99 of the adhesively bonded structure, the acoustic signal measure by LSV would change, indicating occurrence of the disbond. FIG. 9 shows FFT vibration peak of the acoustic wave signal generated by the adhesive actuator 101 and detected by LSV 201 on the repair patch 10 at position A as shown in FIG. 8. FIG. 10 shows FFT vibration peak of the acoustic wave signal generated by the adhesive actuator 101 and detected by LSV 201 on the parent structure 20 at position B as shown in FIG. 8.

Transducer Acting as Sensor

Figure 11:
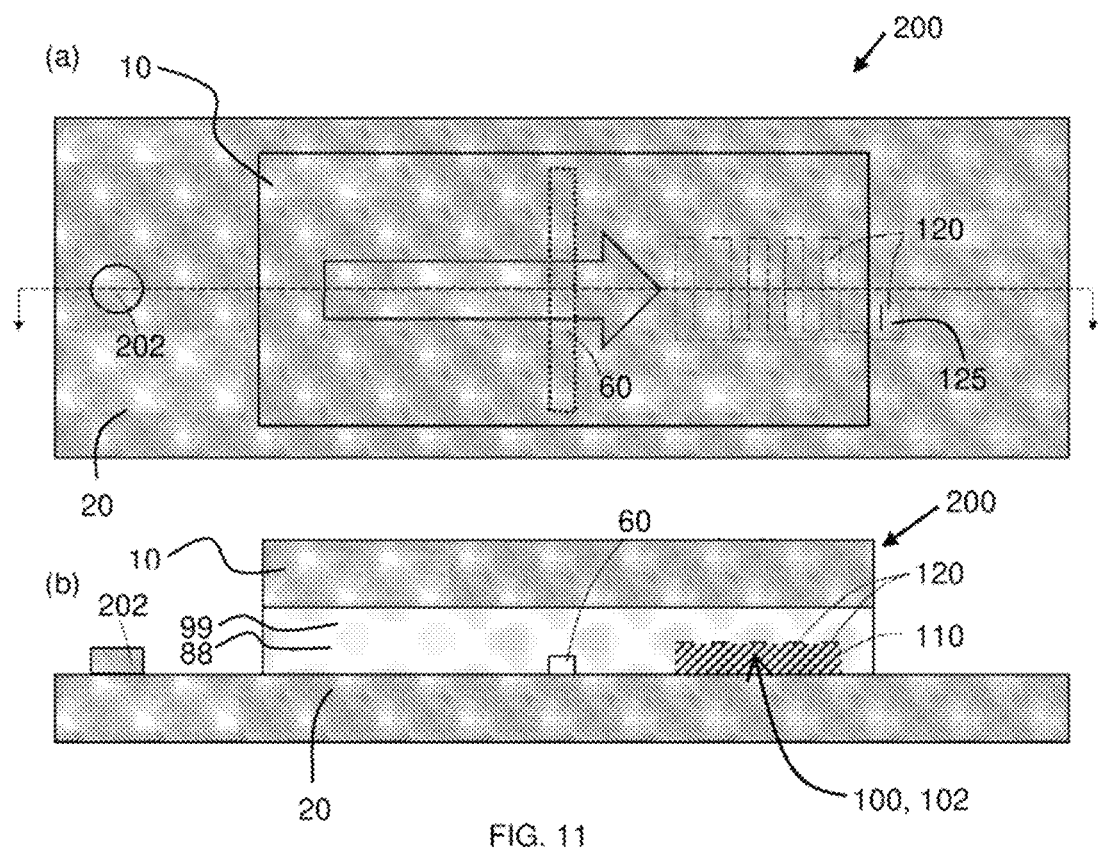
FIG. 11(a) is a top view of a device comprising the transducer of FIG. 1 acting as a sensor and having an acoustic signal generator comprising a discrete ultrasonic actuator.
FIG. 11(b) is a cross-sectional side view of the device of FIG. 11(a).
Figure 12:
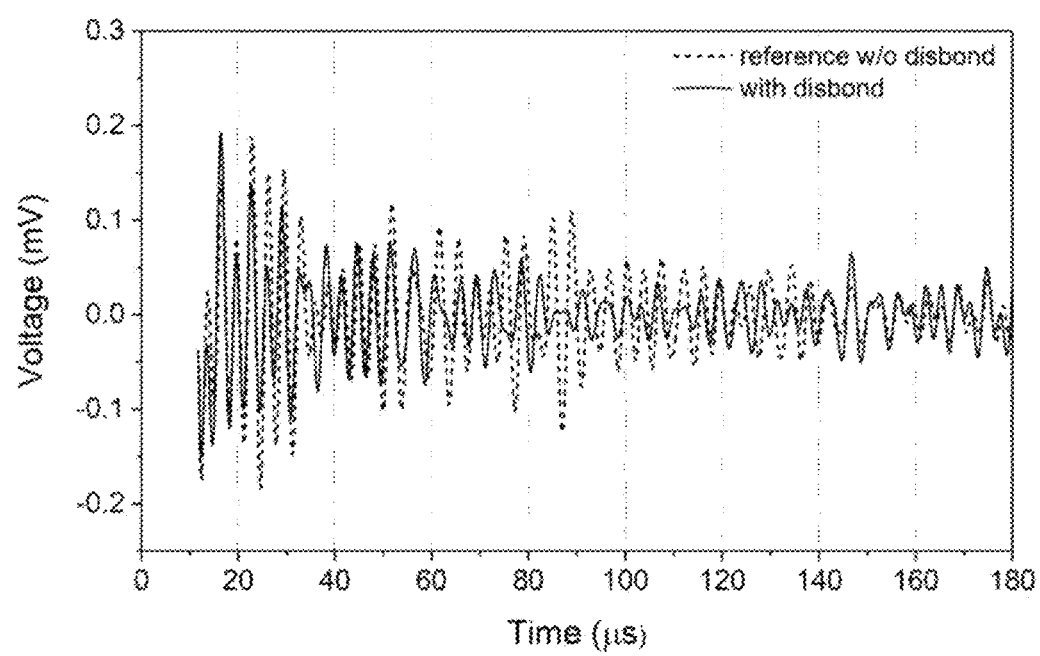
FIG. 12 is a graph comparing a reference signal with a "defect" signal in a time domain, using the device of FIG. 11.
Figure 13:
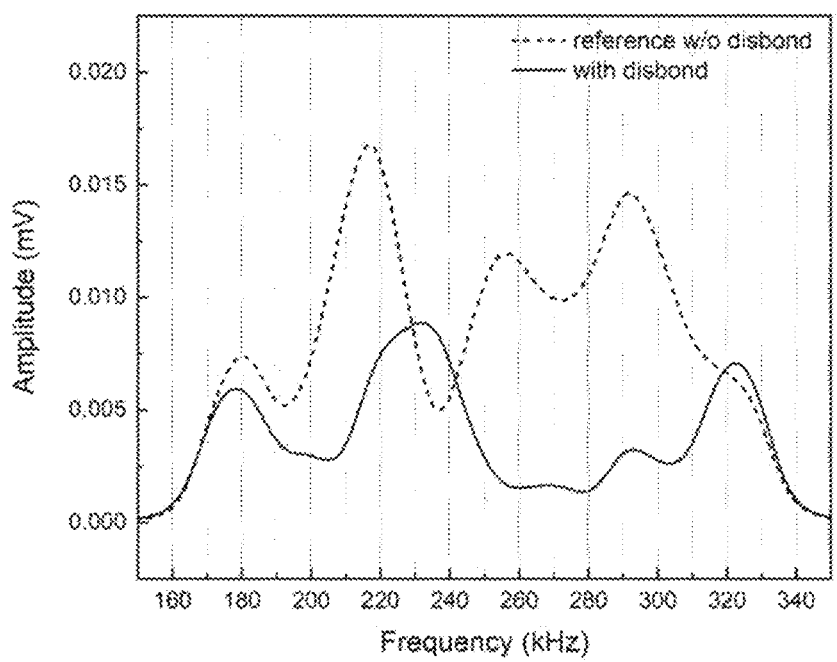
FIG. 13 is a graph comparing a reference FFT spectrum and a "defect" FFT spectrum obtained using the device of FIG. 11.
Figure 14:
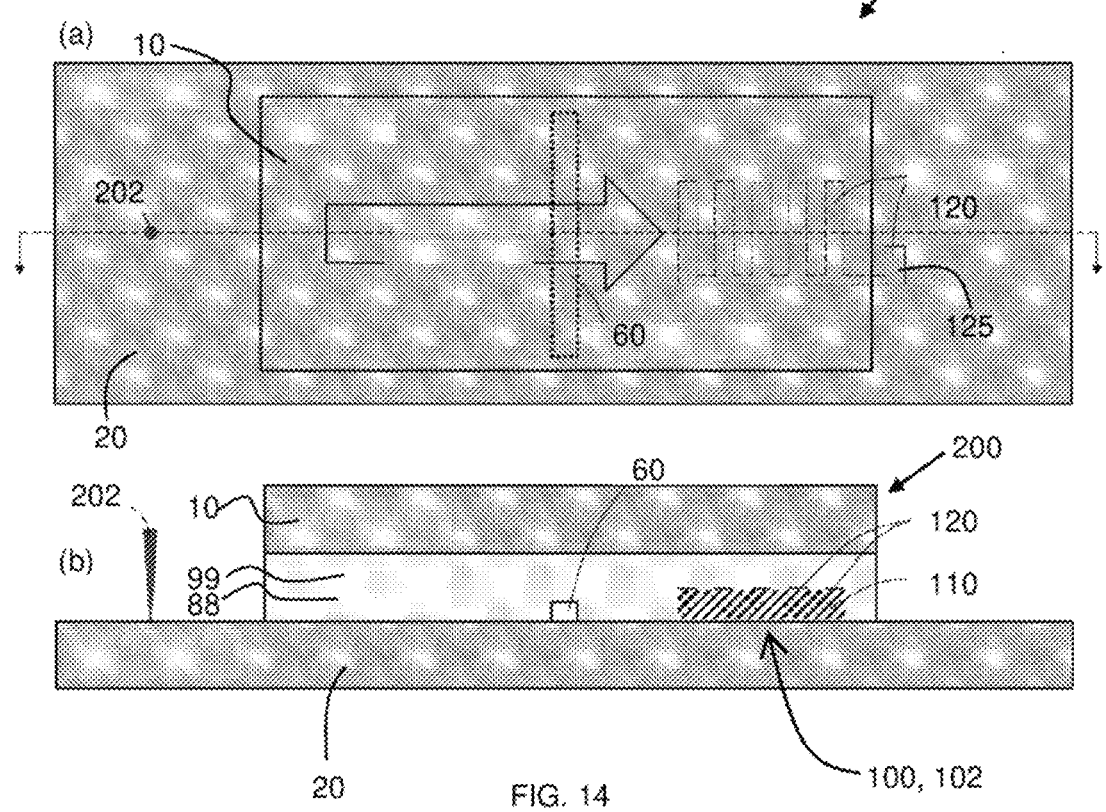
FIG. 14(a) is a top view of a device comprising the transducer of FIG. 1 configured as a sensor and having an acoustic signal generator comprising a pulsed laser.
FIG. 14(b) is a cross-sectional side view of the device of FIG. 14(a).

In the embodiments of the device 200 shown in FIGS. 11 and 14, actuator and sensor roles are reversed compared to the embodiments shown in FIGS. 3 and 8. In the embodiments shown in FIGS. 11 and 14, the integrity of the adhesively bonded structure is monitored by analysing acoustic wave signals generated by an acoustic signal generator 202. The method 300 (as shown in FIG. 20) of monitoring the adhesive bond 99 using embodiments of the device 200 where the transducer 100 acts as a sensor thus comprises the steps of generating an acoustic signal 310 (in such embodiments using the acoustic signal generator 202), passing the acoustic signal through the adhesive bond 99, 320, receiving the acoustic signal that has passed through the adhesive bond 99, 330 (in such embodiments using the transducer 100 acting as a sensor 102), and comparing the acoustic signal that has passed through the adhesive bond 99 with a predetermined reference signal 340. A deviation from the signature or predetermined reference signal (e.g. change in overall waveform or amplitude, change in waveform or amplitude or the time of arrival of a particular wave packet etc.) indicates the presence of defect in the adhesive bond 99. By comparing with the FFT spectrum of the original state as the reference, a change in the FFT spectrum (e.g. change in peak amplitudes, shift in peak frequencies, etc.) indicates the presence of defect. In the example shown in FIG. 11, the acoustic signal generator 202 comprises a discrete ultrasonic actuator 202 such as a piezoelectric ceramic transducer 202 attached onto only the parent structure 20, and the generated acoustic signal is detected by the transducer 100 comprising an adhesive sensor 102. Typical results of acoustic testing of the device 200 shown in FIG. 11 are given in FIGS. 12 and 13.

In an alternative example as shown in FIG. 14, the acoustic signal generator 202 comprises a pulsed laser beam 202, such as an Nd-YAG 1064 nm nanosecond laser pulse with energy up to 220 mJ. Such a laser pulse may be obtained as output from a laser ultrasonic system.

Transducer Acting as Both Actuator and Sensor

Figure 15:
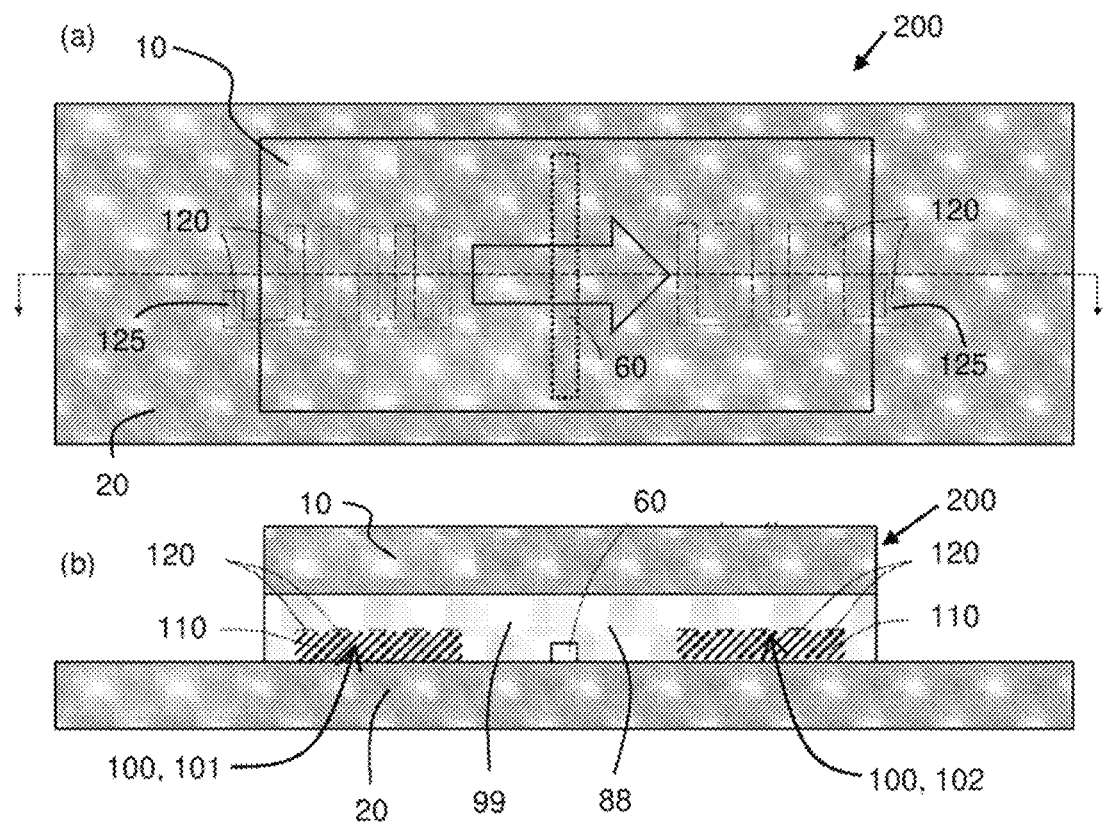
FIG. 15(a) is a top view of a device comprising a first transducer of FIG. 1 acting as an actuator and a second transducer of FIG. 1 acting as a sensor.
FIG. 15(b) is a cross-sectional side view of the device of FIG. 15(a).
Figure 16A:
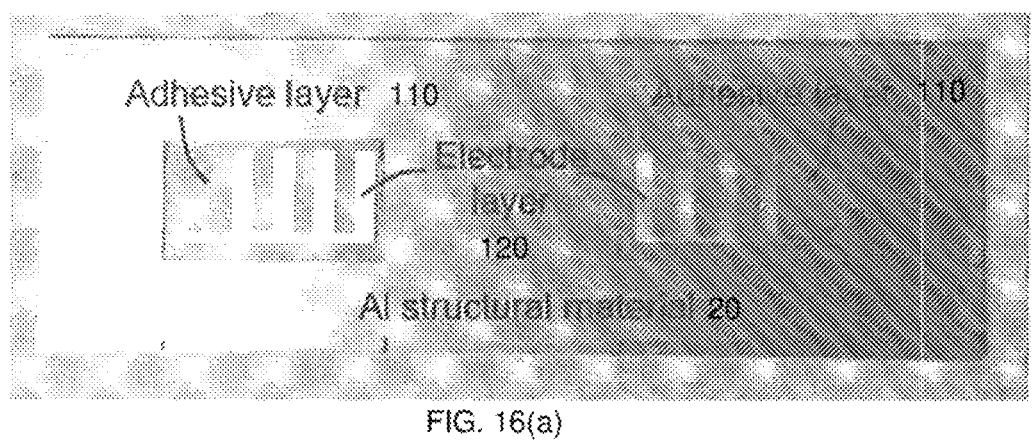
FIG. 16(a) is a photograph of two electrode comb on two first adhesive layers on a structural material before installation of a repair patch.
Figure 16B:
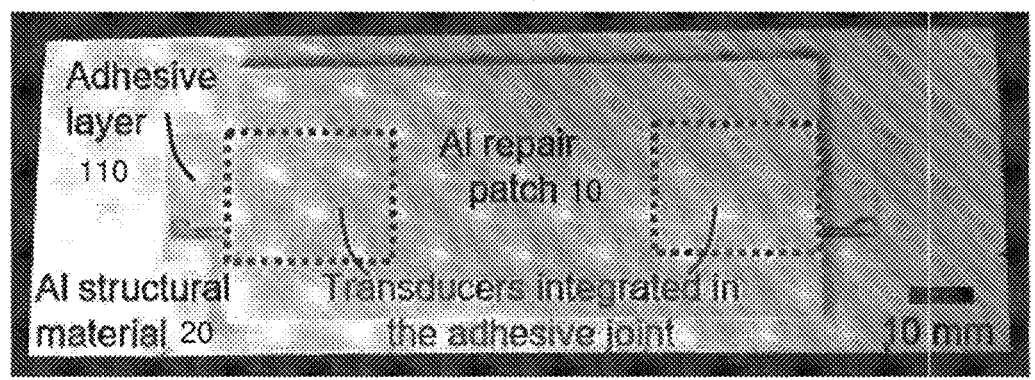
FIG. 16(b) is a photograph of a bonded structure with an actuator and a sensor after installation of the repair patch.

In the embodiment of the device 200 shown in FIG. 15, two transducers 100 are provided. The first transducer 100 acts as an actuator 101 to generate the acoustic signal and the second transducer 100 acts as a sensor 102 to receive the acoustic signal. To form the device 200 of FIG. 15, electrode comb patterns are deposited to form the electrodes 120 on an adhesive layer which forms the transducing adhesive 110 prior to installation of the repair patch 10, as can be seen in FIG. 16(a). After installation of the repair patch 10 by depositing a further layer of the adhesive 88 over the parent structure 20 and the electrodes 120 and applying the repair patch 10 over the further layer of the adhesive 88, the adhesive actuator 101 and sensor 102 are integrated in the adhesively bonded structure as shown in FIG. 16(b). FIG. 16(b) also shows an embodiment of the device 200 where part of the electrode 120 is outside of the footprint of the repair patch 10, as has been mentioned above. In use, an acoustic wave generated by the adhesive actuator 101 propagates in the adhesive bond 99 of the bonded structure comprising the parent structure 20 and the repair patch 10, and is detected by the adhesive sensor 102.

The method 300 (as shown in FIG. 20) of monitoring the adhesive bond 99 using embodiment of the device 200 where the transducer 100 acts as both an actuator and a sensor thus comprises the steps of generating an acoustic signal 310 (in this embodiment using the first transducer 100 acting as an actuator 101), passing the acoustic signal through the adhesive bond 99, 320, receiving the acoustic signal that has passed through the adhesive bond 99, 330 (in this embodiments using the second transducer 100 acting as a sensor 102), and comparing the acoustic signal that has passed through the adhesive bond 99 with a predetermined reference signal 340. A deviation from the signature or predetermined reference signal (e.g. change in overall waveform or amplitude, change in waveform or amplitude or the time of arrival of a particular wave packet etc.) indicates the presence of defect in the adhesive bond 99. By comparing with the FFT spectrum of the original state as the reference, a change in the FFT spectrum (e.g. change in peak amplitudes, shift in peak frequencies, etc.) indicates the presence of defect.

Figure 17:
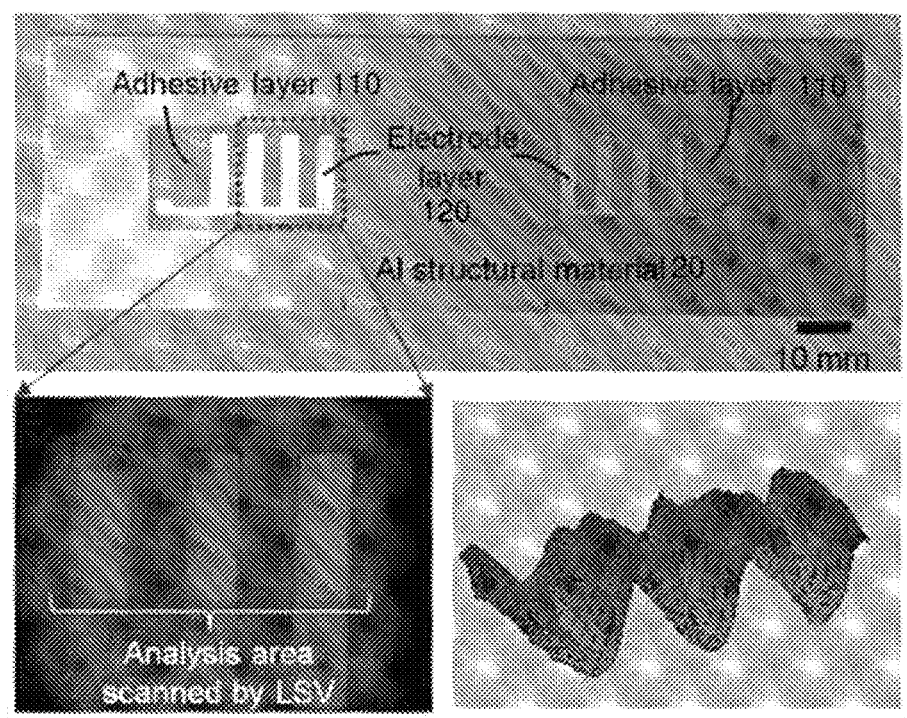
FIG. 17 shows an area scanned by a laser scanning vibrometer to detect an acoustic signal generated by a transducer acting as an actuator at the scanned area and the obtained acoustic wave.
Figure 18:
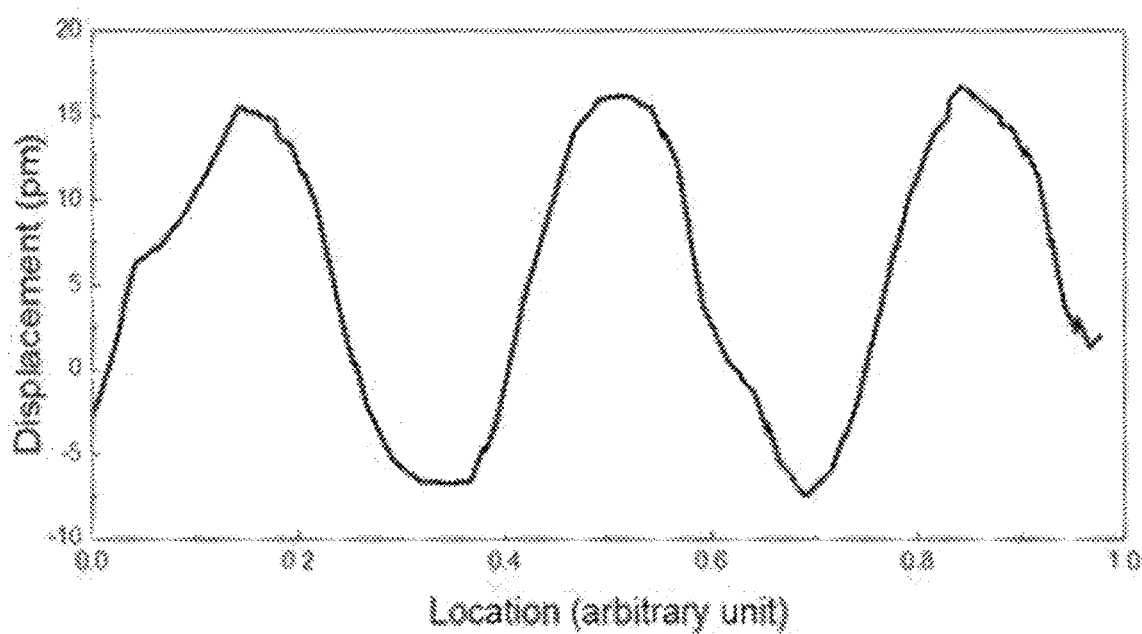
FIG. 18 is a graph of displacement vs location at the scanned area.

FIG. 17 presents an acoustic wave of 250 kHz excited or generated by an adhesive actuator 101 of the device 200 shown in FIG. 15 and detected by a laser scanning vibrometer (LSV), with vibration magnitude of 16 µm under a driving voltage of amplitude 80 V. The effective piezoelectric charge coefficient $d_{33}$ of the epoxy adhesive 110 of the actuator 101 was determined as 0.20 µm/V, with the results as shown in FIG. 18. It will be appreciated that in other embodiments where the transducer 100 acts as an actuator 101 and the transducing adhesive 110 is made of the same epoxy adhesive, similar results can be expected.

Figure 19:
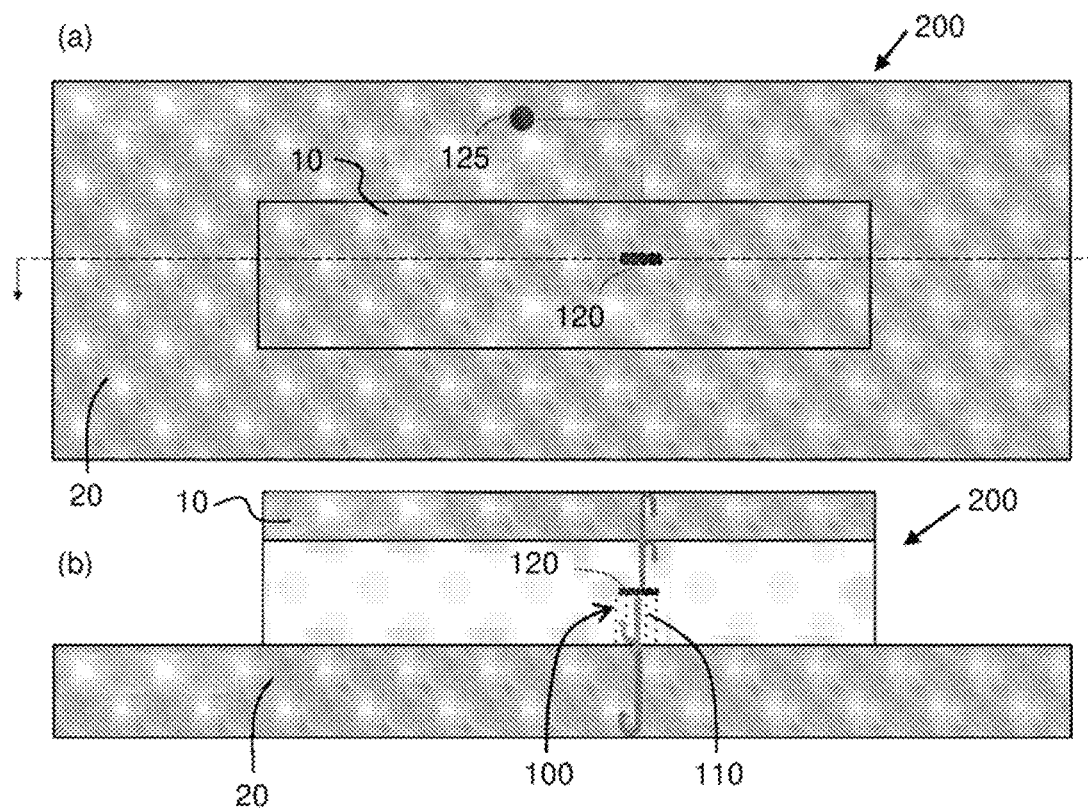
FIG. 19(a) is a top view of a device comprising transducer of FIG. 1 acting as both an actuator and a sensor.
FIG. 19(b) is a cross-sectional side view of the device of FIG. 19(a).

In the embodiment of the device 200 as shown in FIG. 19, thickness of the adhesively bonded structure can be measured or monitored with an adhesive transducer 100, which functions as both an actuator 101 to generate an acoustic wave signal and as a sensor 102 to detect the acoustic wave signal. In this way, the adhesive actuator 101 and sensor 102, or called as an adhesive transducer 100 works in an acoustic pulse echo mode. The acoustic wave is an ultrasonic wave propagating along the thickness direction, and the wave time-of-flight is used for calculating the thickness of the bonded structure, where a decrease in thickness can indicate the presence of a disbond. FIG. 19 schematically illustrates a design with an adhesive transducer to generate acoustic wave signals and sense the echo acoustic signals.

A specific embodiment of the transducing adhesive 110 that may be used in any of the embodiments of the transducer 100 and device 200 described above comprises a mixture of an epoxy adhesive and a piezoelectric component. More specifically, the piezoelectric component may be a lead-free piezoelectric ceramic particles. In this embodiment of the transducing adhesive 110, the composition of $(K_{0.44}Na_{0.52}Li_{0.04})(Nb_{0.84}Ta_{0.10}Sb_{0.06})O_3$ ((K,Na,Li)(Nb,Ta,Sb)$O_3$) was selected as the piezoelectric component. $K_2CO_3$, $Na_2CO_3$, $Li_2CO_3$, $Nb_2O_5$, $Ta_2O_5$, and $Sb_2O_5$ powders were used as the starting materials to form the (K,Na,Li)(Nb,Ta,Sb)$O_3$. The weighed materials were mixed by a planetary ball milling process, followed by calcination at 850° C. for 5 hours, sintering at 1050° C. for 2 hours, and further milled by planetary ball milling to form a ceramic powder of (K,Na,Li)(Nb,Ta,Sb)$O_3$. The ceramic powder was mixed with Araldite AW1106/HV953U epoxy with a concentration of 20 vol % using a planetary mixer, i.e., the lead-free piezoelectric ceramic particles comprised 20% by volume of the composite adhesive. In alternative embodiments, volume of the lead-free piezoelectric ceramic particles in the transducing adhesive may range from 15% to 25%. An adhesive layer of epoxy/(K,Na,Li)(Nb,Ta,Sb)$O_3$ was applied with a film applicator through a mask template to the parent structure, with a film thickness of 50 µm to 70 µm. The epoxy/(K,Na,Li)(Nb,Ta,Sb)$O_3$ adhesive layer was cured under a corona discharge of 55 kV or under an AC electric field of 150 V (amplitude) at 1 kHz. Alternately, the cured epoxy/(K,Na,Li)(Nb,Ta,Sb)$O_3$ adhesive layer may be poled with a DC electric field of 80 kV/mm at 100° C. The effective piezoelectric charge coefficient $d_{33}$ value measured by a laser scanning vibrometer (LSV) was up to 4.9 µm/V. This result demonstrated that the $d_{33}$ coefficient were improved by tens of times by introducing a lead-free piezoelectric ceramic component in the epoxy. The use of the epoxy/(K,Na,Li)(Nb,Ta,Sb)$O_3$ adhesive in the embodiments of the devices 200 described above would significantly improve signal-to-noise ratio for integrity monitoring for adhesively bonded structures.

Whilst there has been described in the foregoing description exemplary embodiments of the present invention, it will be understood by those skilled in the technology concerned that many variations in details of design, construction and/or operation may be made without departing from the present invention. For example, besides the materials disclosed above, the transducing adhesive may instead comprise a methyl methacrylate-based adhesive.

The invention claimed is:

1. A transducer for monitoring integrity of an adhesive bond between a first element and a second element, the transducer comprising:
 a transducing adhesive,
  the transducing adhesive provided to act as at least one of:
   an actuator configured to convert a first electrical signal to a first acoustic signal, and
   a sensor configured to convert a second acoustic signal to a second electrical signal,
  the transducing adhesive comprising:
   (i) an adhesive inherently having a piezoelectric effect,
   (ii) a mixture of an epoxy adhesive and a lead-free piezoelectric ceramic particles, or
   (iii) a combination of (i) and (ii); and
 an electrode provided on the transducing adhesive, the electrode provided to perform at least one of:
  providing a third electrical signal to the transducing adhesive, and
  receiving a fourth electrical signal from the transducing adhesive,
 the first acoustic signal being the same as or different from the second acoustic signal, the first electrical signal being the same as or different from the second electrical signal, the third electrical signal, or the fourth electrical signal, the second electrical signal being the same as or different from the third electrical signal or the fourth electrical signal, the third electrical signal being the same as or different from the fourth electrical signal,
 the transducer being at least partially provided in the adhesive bond between the first element and the second element, at least one of the first acoustic signal and the second acoustic signal being passed through the adhesive bond.

2. The transducer of claim 1, wherein the adhesive inherently having the piezoelectric effect comprises an epoxy adhesive having the piezoelectric effect.

3. The transducer of claim 1, wherein the transducing adhesive comprises bisphenol/diamine-based epoxy.

4. The transducer of claim 1, wherein the transducing adhesive comprises a methyl methacrylate-based adhesive.

5. The transducer of claim 1, wherein the lead-free piezoelectric ceramic comprises $(K_{0.44}Na_{0.52}Li_{0.04})(Nb_{0.84}Ta_{0.10}Sb_{0.06})O_3$, and wherein a volume of the lead-free piezoelectric ceramic particles in the transducing adhesive ranges from 15% to 25%.

6. The transducer of claim 1, the transducing adhesive having been exposed to at least one of a direct current electric field or a corona discharge.

7. The transducer of claim 1, wherein the at least one of the first acoustic signal and the second acoustic signal is a guided ultrasonic wave signal.

8. The transducer of claim 1, wherein the at least one of the first acoustic signal and the second acoustic signal is an ultrasonic Lamb wave signal.

9. The transducer of claim 1, wherein the electrode has a comb-like pattern comprising fingers, and periodicity of the fingers corresponds to a wavelength of the at least one of the first acoustic signal and the second acoustic signal.

10. A device for monitoring integrity of an adhesive bond between a first element and a second element, the device comprising:
 a first transducer comprising the transducer of claim 1 provided at least partially in the adhesive bond between the first element and the second element, the adhesive bond comprising a bonding adhesive provided between the first element and the second element, the bonding adhesive comprising a same material as the transducing adhesive, determination of integrity of the adhesive bond being achieved by analysing the at least one of the first acoustic signal and the second acoustic signal that has passed through the adhesive bond.

11. The device of claim 10, wherein the transducing adhesive and at least part of the electrode are provided between the bonding adhesive and the first element.

12. The device of claim 10, wherein, when the first transducer is provided to act as an actuator to generate the at least one of the first acoustic signal and the second acoustic signal, the device further comprises:
 an acoustic signal receiver provided to receive the at least one of the first acoustic signal and the second acoustic signal that is passed through the bonding adhesive from the first transducer.

13. The device of claim 12, wherein the acoustic signal receiver comprises one of:
 a laser scanning vibrometer,
 a discrete piezoelectric sensor, and
 a second transducer provided to act as a sensor to detect the at least one of the first acoustic signal and the second acoustic signal.

14. The device of claim 10, wherein, when the first transducer is provided to act as a sensor to detect the at least one of the first acoustic signal and the second acoustic signal, the device further comprises:
 an acoustic signal generator provided to generate the at least one of the first acoustic signal and the second acoustic signal that is passed through the bonding adhesive to the first transducer.

15. The device of claim 14, wherein the acoustic signal generator comprises one of:
 a pulsed laser,
 a discrete piezoelectric actuator, and
 a second transducer provided to act as an actuator.

16. The device of claim 10, wherein analysing the at least one of the first acoustic signal and the second acoustic signal comprises:
 comparing at one of the first acoustic signal and the second acoustic signal that has passed through the adhesive bond with a predetermined reference signal, deviation of the at least one of the first acoustic signal and the second acoustic signal that has passed through the adhesive bond from the reference signal being indicative of presence of a defect in the adhesive bond.

17. The device of claim 10, wherein the transducing adhesive is integral with the bonding adhesive, the first transducer being provided to act as an actuator to generate the at least one of the first acoustic signal and the second acoustic signal that is passed through the bonding adhesive, the first transducer being further provided to act as a sensor to detect an echo of the at least one of the first acoustic signal and the second acoustic signal that has passed through the bonding adhesive for determining thickness of the bonding adhesive, and thickness of the bonding adhesive being correlatable with presence of a defect in the adhesive bond.

18. A method of monitoring integrity of an adhesive bond between a first element and a second element, the method comprising the steps of:
   (a) generating at least one of a first acoustic signal and a second acoustic signal;
   (b) passing the at least one of the first acoustic signal and the second acoustic signal through the adhesive bond;
   (c) receiving the at least one of the first acoustic signal and the second acoustic signal that has passed through the adhesive bond; and
   (d) comparing the at least one of the first acoustic signal and the second acoustic signal that has passed through the adhesive bond with a predetermined reference signal;
   at least one of step (a) and step (c) being performed by a transducing adhesive, the transducing adhesive provided in a transducer, the transducer comprising:
      the transducing adhesive provide to act as at least one of:
         an actuator to convert a first electrical signal to the first acoustic signal, and
         a sensor to convert the second acoustic signal to a second electrical signal
      the transducing adhesive comprising:
         (i) an adhesive inherently having a piezoelectric effect,
         (ii) a mixture of an epoxy adhesive and a lead-free piezoelectric ceramic particles, or
         (iii) a combination of (i) and (ii); and
      an electrode provided on the transducing adhesive, the electrode provide to perform at least one of:
         providing a third electrical signal to the transducing adhesive, and
         receiving a fourth electrical signal from the transducing adhesive,
   the first acoustic signal being the same as or different from the second acoustic signal, the first electrical signal being the same as or different from the second electrical signal, the third electrical signal, or the fourth electrical signal, the second electrical signal being the same as or different from the third electrical signal or the fourth electrical signal, the third electrical signal being the same as or different from the fourth electrical signal,
   the transducer being at least partially provided in the adhesive bond between the first element and the second element, at least one of the first acoustic signal and the second acoustic signal being passed through the adhesive bond.

19. The method of claim 18, wherein in step (d), deviation of the at least one of the first acoustic signal and the second acoustic signal that has passed through the adhesive bond from the reference signal is indicative of presence of a defect in the adhesive bond.

20. The method of claim 18, wherein both step (a) and step (c) are performed by the transducer.

21. The method of claim 20, further comprising the steps of:
   (e) determining thickness of the bonding adhesive and
   (f) correlating thickness of the bonding adhesive with presence of a defect in the adhesive bond.

* * * * *